United States Patent [19]

Dugan et al.

[11] 4,135,988
[45] Jan. 23, 1979

[54] ONE HUNDRED PERCENT PATTERN PLATING OF PLATED THROUGH-HOLE CIRCUIT BOARDS

[75] Inventors: William P. Dugan, Pomona; John A. Muhr, Claremont, both of Calif.

[73] Assignee: General Dynamics Corporation, Pomona, Calif.

[21] Appl. No.: 873,196

[22] Filed: Jan. 30, 1978

[51] Int. Cl.[2] .................. C25D 5/02; H05K 3/06
[52] U.S. Cl. ................................. 204/15; 427/97; 427/98; 174/68.5; 29/625
[58] Field of Search ............... 29/625, 628; 204/15, 204/20; 427/97, 98; 174/68.5

[56] References Cited

U.S. PATENT DOCUMENTS

| | | | |
|---|---|---|---|
| 3,457,638 | 7/1969 | Johnson | 174/68.5 |
| 3,606,677 | 9/1971 | Ryan | 29/625 |
| 3,673,680 | 7/1972 | Tanaka et al. | 204/15 |
| 3,855,692 | 12/1974 | Dugan | 29/625 |
| 4,088,545 | 5/1978 | Supnet | 204/15 |

Primary Examiner—C. W. Lanham
Assistant Examiner—Daniel C. Crane
Attorney, Agent, or Firm—Henry M. Bissell; Edward B. Johnson

[57] ABSTRACT

A process for manufacturing printed circuit boards having plated through-holes. An epoxy glass substrate is laminated on opposite surfaces by a thin copper foil and subsequently apertures are drilled through the laminated substrate where the plated through-holes are desired. The exposed surfaces of the apertures are electroless copper plated. Then by means of a photoresist, the desired circuit images and the apertures are exposed and the initial electroless copper plating is removed again. The apertures and the desired circuit images are again plated by electroless copper plating to establish an initial copper thickness. The apertures in the desired circuit images are then electro-copper plated to the approximate thickness of the photoresist and preferably so that their thickness is less than the thickness of the photoresist. The copper plating is then electro-solder plated. The remaining photoresist is removed and the now exposed laminated copper foil is chemically removed to provide the finished printed circuit board.

8 Claims, 10 Drawing Figures

ONE HUNDRED PERCENT PATTERN PLATING OF PLATED THROUGH-HOLE CIRCUIT BOARDS

BACKGROUND OF THE INVENTION

1. Field of the Invention

This invention relates to the manufacture of printed circuit boards and, more particularly, to such boards having plated through-holes.

2. Description of the Prior Art

Printed circuit boards having plated through-holes are used extensively in electronic modules. The plated through-holes serve the purpose of establishing electrical connections between circuit components on opposite surfaces of the board. Generally such printed circuit boards having plated through-holes have been produced in the past either by a so-called subtractive or an additive process.

The subtractive process is more commonly employed. A copper clad substrate is utilized and holes are drilled at predetermined locations. Then the substrate is copper plated throughout including the inside surfaces of the holes. The thus copper plated circuit areas and the surfaces of the holes are masked in any conventional manner, for example, by photoresist and subsequent exposure and etching. Hence, when the mask is removed, the copper plated circuitry and the surfaces of the holes which are copper plated remain.

The subtractive process which has been described, for example, in the U.S. Pat. to Tanaka, No. 3,673,680, provides for good chemical adhesion between the original substrate and the circuitry. The reason for the good chemical adhesion is that the plating readily adheres to the clad. On the other hand, the clad is securely laminated to the substrate. However, difficulties have been experienced in this process in attempting to control the thickness of the plating as well as the smoothness of the plating surface. Moreover, uniformity of the plating and the chemical etching is not readily attainable.

The additive process is generally described in the U.S. Pat. to Ryan, No. 3,606,677. Here the circuitry is directly generated on an unclad substrate. The plating is only applied to precise areas defined by the photoimage, say between a photoresist layer. Hence, it is possible to provide strict dimensional control. The sidewalls of the photoresist prevent undesired growth of the plating. Therefore, the line width of the plating is precise enough to reduce the space required between adjacent conductors. This in turn means that the circuit density can be made much great. Since only the circuit areas are plated, the strict controls required for the chemical etching in the subtractive process to meet plating thickness and uniformity requirements are eliminated.

The inherent problem of the additive process is the lack of adhesion strength between the substrate and the plating. Claims have been made that this plating can produce sufficient adhesion strength, equal to that produced by foil lamination. However, this is not generally accepted by the industry and by the Armed Forces.

It will now be seen that each of the above-described processes for manufacturing printed circuit boards has certain inherent advantages; by the same token, they also have inherent limitations. A continuous effort is being made to achieve highdensity packaging of electronic components. This in turn requires the achievement of a reduction on the line width of conductors and concurrently of the space between conductors while still maintaining good adhesion strength between the substrate and the circuits printed thereon.

SUMMARY OF THE INVENTION

The present invention is an improved process for manufacturing printed circuit boards having plated through-holes. The new process incorporates the inherent advantages of both the subtractive and the additive manufacturing processes as discussed hereinabove. At the same time, the process of the invention eliminates the limitations of the processes of the prior art. Therefore, the process of the invention enables a higher density packaging of electronic components and circuit paths. This is due to the fact that the line width of the conductors can be reduced and at the same time, the space between conductors. Nevertheless good adhesion strength between the conductors and the board substrate is provided.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENTS

Figure 1:
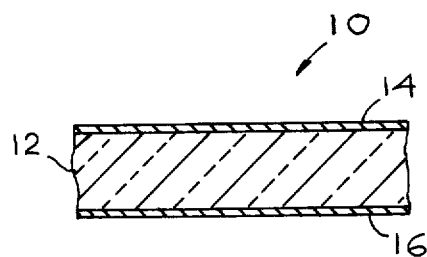
FIGS. 1–10 are a series of fragmentary sectional views corresponding to successive process steps in the preparation of a printed circuit board with plated through holes in accordance with the present invention.

Referring now to the drawings, FIGS. 1–10 illustrate the sequence of the process steps in accordance with the present invention beginning with the basic process material and ending with the finished product, which is a printed circuit board with plated through-holes.

The basic starting material is shown in FIG. 1 and consists of a copper clad epoxy glass board 10. The board 10 hence consists of an epoxy glass substrate 12 which may be of a material known as "A" stage glass epoxy. The substrate 12 is laminated with an extremely thin copper clad or film 14 and 16 on opposite sides thereof. The copper film 14 and 16 has a thickness on the order of 0.00014 inch while the substrate has a thickness of approximately 0.062 inch.

Figure 2:
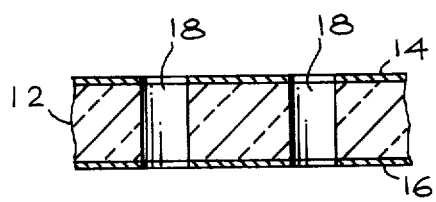

Holes or apertures 18 are formed through the laminated board 10 at predetermined locations where plated through-holes are required. The holes 18 are illustrated in FIG. 2 and may be formed, for example, by drilling by a tape controlled drilling machine. The board 10 may be supported during the drilling process by an epoxy glass or aluminum back-up sheet and a paper phenolic entry material.

It is desirable, initially, to sensitize the exposed surfaces of the epoxy glass substrate 12 at the drilled holes 18. This may be effected by a suitable catalyst, such as palladium chloride.

Figure 3:
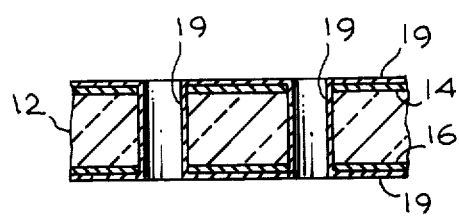

Subsequently, a thin film or layer of copper 19 is plated over the entire board of conventional means. This may, for example, be effected by electroless copper plating to provide a film approximately 0.00001 inch thick. The layer 19 also covers the surfaces of the holes 18, as shown in FIG. 3.

If the board 10 is not continuously processed after the electroless copper plating step, the board can be stored indefinitely because the copper layer 19 will act as a protective film during storage. When the board 10 is retrieved from storage for further processing, the electroless copper film 19 may have become oxidized and contaminated. Hence, the copper film 19 is again removed from the board 10. This may, for example, be effected by a chemical etch consisting of ammonium persulfate to remove the film 19 at the surfaces of the holes 18. Then a fresh film or layer of electroless copper 19 is plated over the board 10 and onto the surfaces of the holes 18.

The desired circuit images on both sides of the board 10 may be applied by any conventional means. Preferably, however, a dry film photoresist is applied, subsequently exposed and developed. To this end the board 10 is initially cleaned. This may be effected by a sander or by a brush having fiber bristles and pumice. Subsequently, the board may receive a tap water rinse and may be dried by filtered compressed air.

A dry film photoresist layer 20 and 22 is applied to opposite surfaces of the board 10. The photoresist layer may, for example, consist of DuPont Riston 218R. The photoresist layers may be applied by passing the resist and board through a laminator. This may be effected at a temperature between 220° F. and 255° F., depending upon the type of laminator utilized. The thickness of the photoresist layer is determined by the desired thickness of the plated circuit. Normally the photoresist layer is somewhat thicker, say by about 0.0003 inch than the desired thickness of the plated circuit. By way of example, to achieve a plated circuit of approximately 1.5 mil thickness, the photoresist layer should have a thickness of 1.8 mil.

Figure 4:
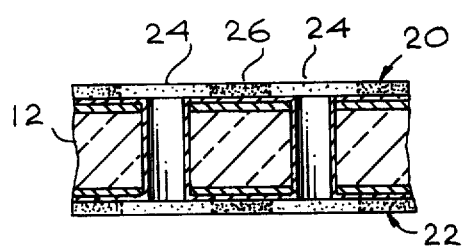

The thus-applied or laminated photoresist layers 20 and 22 are then photographically exposed through a suitable mask. Subsequently, the photoresist layers 20 and 22 are developed. This will remove non-polymerized areas 24 which are susceptible to the developer. These areas 24 on the photoresist layers 20 and 22 correspond to the areas of the circuits to be plated and to the surfaces of the holes 18. The photoresist layers 20 and 22 then have polymerized areas 26 which are resistant to the etchant and which cover all other areas of the photoresist layers 20 and 22 as shown in FIG. 4. The DuPont Riston 218R photoresist may be exposed by a light source in a vacuum of 23 inches of mercury or more for a time of approximately one and one-quarter minutes. Following exposure, the vacuum is released and the resist is normalized at room temperature for at least 30 minutes. Then the photoresist may be developed in a suitable processor.

Figure 5:
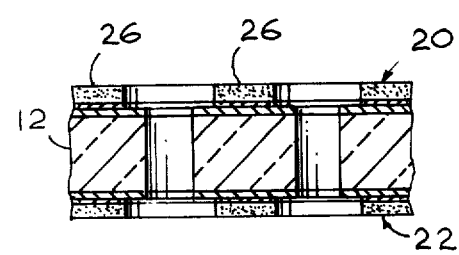

FIG. 5 illustrates the board 10 after the non-polymerized areas 24, which are susceptible to the developer have been removed. This may, for example, be effected by immersion in a suitable developing solution which exposes the holes or apertures 18 and the desired circuit images on both sides of the board.

Figure 6:
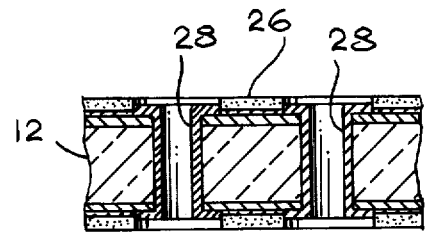

During this process, the electroless copper film 19 may have become oxidized or contaminated. Hence, preferably the copper film 19 is removed at this time or stripped from the holes 18 and the circuit areas. This may be effected with a chemical etch consisting, for example, of ammonium persulfate. A fresh film of electroless copper 28 is then applied to the surfaces of the holes 18 and the desired circuit areas as shown in FIG. 6. In accordance with the present invention, it has been discovered that it is not necessary to again sensitize the surfaces which are to be re-plated with a film of electroless copper.

Figure 7:
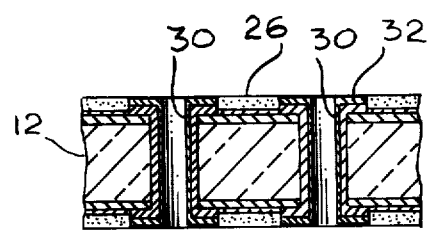

The next plating step is an electro-copper plating step. To this end a pyrophosphate process may be used, for example, to achieve a minimum copper plating 30 (see FIG. 7) of one mil over the surfaces of the holes and a copper circuit 32 of approximately 1.5 mils. The circuit plating 32 is contained within the boundary of the walls of the polymerized photoresist 26 as shown in FIG. 7.

Figure 8:
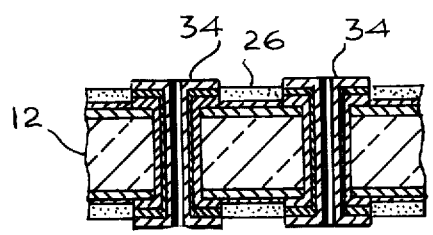

After the electro-copper plating step, the exposed copper layers 30 and 32 are then electro-solder plated. This plating is continued until a minimum thickness of 0.0003 inch of solder layer 34 is plated on the surfaces of the holes 18. This is illustrated in FIG. 8.

Figure 9:
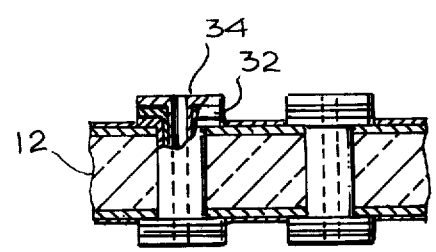
Figure 10:
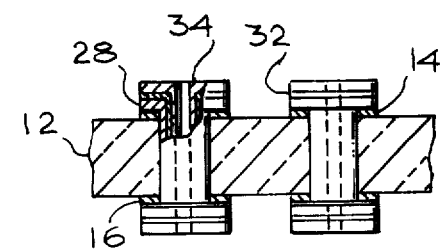

Following the electro-solder plating, the polymerized photoresist 26 is removed. By way of example it may be stripped with a suitable solvent as shown in FIG. 9. Thereafter all exposed copper from the original films 14 and 16 is chemically etched away by a suitable etching solution. An etchant spray of chromic-sulfuric acid at 120° F. with a spray pressure of 30 psig may be appropriate. The finished plated through-hole printing circuit board is illustrated in FIG. 10.

It is to be noted that only the principal steps of the inventive process have been specifically set forth hereinabove. Other incidental steps, such as cleaning, rinsing and the like may have to be included in the process as is well known to those skilled in the art.

Similarly, the thickness of the board, of the clad and the platings, as well as the number and configuration of the circuit path and the number and location and dimensions of the holes are determined by the specific requirements of the intended application of the printed circuit board. For example, while a single substrate clad on both sides is illustrated as the initial board material, the process of the invention is equally applicable to multilayer circuit boards as well.

By use of the present process generally referred to as "one hundred percent pattern" plating, it is possible to reduce the conductor width and the space between conductors to 5 mils ± 1 mil. Excellent chemical adhesion is achieved between the plated copper and the thin layer of copper clad which is laminated securely to the epoxy glass substrate. The extremely thin copper clad having a thickness of 0.14 mil is readily removed without adversely affecting the finished product. Precise control of the width of the circuit leads is readily achieved by containing the copper plating within the boundary of the walls of the polymerized photoresist. An example of a preferred photoresist has been given. Straight vertical copper circuit walls are also obtainable with this process. This is due to the fact that minimum undercutting of the plated circuit path occurs. The reason for this is that there is no electrolytic copper build-up on the copper clad which is later removed by etching. In this manner, higher density packaging of electronic components is readily achieved.

Although there have been described above particular methods for one hundred percent pattern plating of plated through-hole circuit boards in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. A process for manufacturing an electrical printed circuit board having plated through-holes for electrically interconnecting circuits on opposite surfaces of the board, said process comprising the steps of:
   (a) laminating a thin copper foil on opposite surfaces of an epoxy glass substrate;
   (b) forming apertures through the laminated assembly at the locations of the desired plated through-holes;
   (c) electroless copper plating the exposed surfaces of the apertures and the opposite surfaces of the substrate;
   (d) applying a layer of photoresist to both opposite surfaces of the apertured laminated assembly to define resist layer portions susceptible to a chemical developer over the apertures and a desired circuit image on opposite surfaces, and resist portions resistant to chemical etchant over the remainder thereof;
   (e) chemically removing those portions of the photoresist layer susceptible to the developer to expose the apertures and the desired circuit image on opposite surfaces of the substrate;
   (f) removing the electroless copper plating;
   (g) plating again by electroless copper plating the surfaces of the apertures and the desired circuit image to establish an initial copper thickness;
   (h) electroplating with copper the surfaces of the apertures and the desired circuit image to the approximate thickness of the photoresist;
   (i) electroplating the copper plating with solder;
   (j) removing the remaining portions of the photoresist from the board; and
   (k) chemically removing the exposed laminated copper foil from the substrate.

2. The process defined in claim 1 wherein the thin copper foil has a thickness of about 0.00014 inch, and the epoxy glass substrate has a thickness of about 0.062 inch.

3. The process defined in claim 1 wherein the layer of photoresist has a thickness of about 0.0018 inch.

4. The process defined in claim 3 wherein the plated copper circuit image has a thickness of about 0.0015 inch.

5. The process defined in claim 1 wherein the thickness of the solder plating is about 0.0003 inch.

6. A process for manufacturing an electrical printed circuit board having plated through-holes for connecting circuits on opposite surfaces of the board comprising the steps of:
   (a) laminating a copper foil having a thickness of about 0.00014 inch on opposite surfaces of an epoxy glass substrate board, the substrate board being substantially flat and having a thickness of about 0.062 inch;
   (b) drilling a plurality of apertures through the laminated substrate board at the desired locations of the plated through-holes;
   (c) sensitizing the exposed surfaces of the substrate board in the apertures by a catalyst;
   (d) electroless copper plating the surfaces of the apertures and the opposite surfaces of the substrate board to establish an initial copper thickness;
   (e) laminating at an elevated temperature, a dry film photoresist having a thickness of approximately 0.0018 inch to opposite surfaces of the drilled assembly;
   (f) photographically exposing and developing the photoresist to define non-polymerized portions over the apertures and the desired circuit images and polymerized portions over the remainder of the photoresist;
   (g) chemically removing the non-polymerized portions of the photoresist to expose the apertures and the desired circuit images;
   (h) removing the electroless copper plating;
   (i) reapplying electroless copper plating over the surfaces of the apertures and the desired circuit images to establish an initial copper thickness;
   (j) electroplating with copper the surfaces of the apertures to a thickness of approximately one mil and the circuit image to a thickness of approximately 1.5 mil;
   (k) electroplating with solder the copper plating to a thickness of 0.0003 inch;
   (l) removing the polymerized photoresist from the board; and
   (m) chemically etching the now exposed copper foil from the substrate.

7. A process for manufacturing a printed circuit board having plated through-holes for interconnecting circuits on opposite sides of the board, said process comprising the steps of:
   (a) laminating a 0.00014 inch copper foil on opposite surfaces of an epoxy glass substrate board, the board being substantially flat and having a thickness of 0.062 inch;
   (b) drilling apertures through the laminated assembly at the desired locations of the plated through-holes;
   (c) sensitizing the exposed epoxy glass surfaces of the drilled apertures by applying a catalyst;
   (d) electroless copper plating the copper film over the entire substrate board;
   (e) laminating at an elevated temperature a dry film photoresist having a thickness of about 0.0018 inch to opposite surfaces of the drilled substrate board;
   (f) photographically exposing and developing the photoresist to define portions which are not polymerized over the apertures and the desired circuit images and polymerized portions over the remainder of the photoresist;
   (g) chemically removing the non-polymerized portions of the photoresist to expose the surfaces of the apertures and the desired circuit images;
   (h) stripping the electroless copper film from the surfaces exposed by the removal of the non-polymerized portions of the photoresist;
   (i) electroless copper plating again the surfaces of the apertures and the desired circuit images to establish an initial copper thickness;
   (j) electroplating copper with the surfaces of the apertures to a thickness of one mil and the circuit images to a thickness of 1.5 mil;
   (k) electroplating with solder the copper plating to a thickness of 0.0003 inch;
   (l) removing the polymerized photoresist from the board; and
   (m) chemically etching the now exposed copper film and copper foil from the substrate board.

8. The process defined in claim 7 wherein the substrate board is backed by a sheet of backing material before drilling apertures through the board.